United States Patent
Uemura et al.

(10) Patent No.: US 10,483,136 B2
(45) Date of Patent: Nov. 19, 2019

(54) CERAMIC HEATER AND ELECTROSTATIC CHUCK

(71) Applicant: NGK SPARK PLUG CO., LTD., Nagoya-shi, Aichi (JP)

(72) Inventors: Naoya Uemura, Toyohashi (JP); Yosuke Shinozaki, Tajimi (JP); Kohei Yamamoto, Komaki (JP)

(73) Assignee: NGK SPARK PLUG CO., LTD., Nagoya (JP)

(*) Notice: Subject to any disclaimer, the term of this patent is extended or adjusted under 35 U.S.C. 154(b) by 279 days.

(21) Appl. No.: 15/093,967

(22) Filed: Apr. 8, 2016

(65) Prior Publication Data

US 2016/0307787 A1    Oct. 20, 2016

(30) Foreign Application Priority Data

Apr. 20, 2015    (JP) ................. 2015-085931

(51) Int. Cl.
  *H01L 21/683* (2006.01)
  *H01L 21/67* (2006.01)
  *H05B 3/28* (2006.01)

(52) U.S. Cl.
  CPC .... *H01L 21/67103* (2013.01); *H01L 21/6831* (2013.01); *H05B 3/283* (2013.01)

(58) Field of Classification Search
  CPC ......... H01L 21/67103; H01L 21/67248; H01L 21/6831; H05B 3/283; H05B 3/18
  USPC ................. 219/444.1, 468.1, 468.2
  See application file for complete search history.

(56) References Cited

U.S. PATENT DOCUMENTS

| | | | |
|---|---|---|---|
| 2002/0043528 A1* | 4/2002 | Ito | H01L 21/67103 219/444.1 |
| 2003/0000937 A1 | 1/2003 | Ito | |
| 2004/0060925 A1* | 4/2004 | Zhou | H05B 3/143 219/543 |

(Continued)

FOREIGN PATENT DOCUMENTS

| | | | |
|---|---|---|---|
| JP | 2001-223257 A | 8/2001 | |
| JP | 2002-093677 A | 3/2002 | |

(Continued)

OTHER PUBLICATIONS

Korean Intellectual Property Office, Office Action (Notification of Reason for Refusal) issued in corresponding Application No. 10-2016-0040295, dated Mar. 12, 2018.

(Continued)

*Primary Examiner* — Michael G Hoang
(74) *Attorney, Agent, or Firm* — Stites & Harbison, PLLC; Jeffrey A. Haeberlin; James R. Hayne

(57) ABSTRACT

As viewed in plane, a ceramic heater includes zone heat-generating elements disposed in respective heating zones so as to heat a ceramic substrate independently. In the heating zone having a hole region, the zone heat-generating element is formed of a linear heat-generating conductor which has parallel segments disposed in parallel, and a turning-back segment which connects, while turning back, the parallel segment of the heat-generating conductor extending toward the hole region to the adjacent parallel segment of the heat-generating conductor so as to prevent the parallel segment extending toward the hole region from overlying the hole region.

7 Claims, 10 Drawing Sheets

(56) References Cited

U.S. PATENT DOCUMENTS

| | | | |
|---|---|---|---|
| 2004/0108308 A1* | 6/2004 | Okajima | H01L 21/67103 219/468.1 |
| 2004/0155025 A1* | 8/2004 | Ito | H01L 21/67103 219/444.1 |
| 2005/0173410 A1 | 8/2005 | Okajima et al. | |
| 2006/0221539 A1* | 10/2006 | Morita | H01L 21/67103 361/234 |
| 2018/0207635 A1* | 7/2018 | Kouge | G01N 35/00 |

FOREIGN PATENT DOCUMENTS

| | | | |
|---|---|---|---|
| JP | 2005-166354 A | 6/2005 | |
| JP | 3157070 U | 1/2010 | |
| KR | 10-2005-0000852 A | 1/2005 | |
| KR | 10-2008-0046144 A | 5/2008 | |

OTHER PUBLICATIONS

Japan Patent Office, Office Action (Notification of Reasons for Refusal) issued in corresponding Application No. 2015-085931, dated Dec. 18, 2018.

\* cited by examiner

TEMPERATURE
DISTRIBUTION

LOW ———→ HIGH     TEMPERATURE

CERAMIC HEATER AND ELECTROSTATIC CHUCK

CROSS REFERENCE TO RELATED APPLICATION

The present application claims priority to Japanese Patent Application No. 2015-085931, which was filed on Apr. 20, 2015, the disclosure of which is herein incorporated by reference in its entirety.

BACKGROUND OF THE INVENTION

Field of the Invention

The present invention relates to a ceramic heater capable of heating, for example, a semiconductor wafer and to an electrostatic chuck used, for example, in fixing a semiconductor wafer, in correcting flatness of a semiconductor wafer, and in transporting a semiconductor wafer.

Description of Related Art

Conventionally, a semiconductor fabrication apparatus has performed, for example, dry etching (e.g., plasma etching) on a semiconductor wafer (e.g., a silicon wafer). Since, in order to enhance accuracy of dry etching, the semiconductor wafer must be securely fixed, an electrostatic chuck has been proposed as means for fixing the semiconductor wafer. The electrostatic chuck fixes the semiconductor wafer by electrostatic attraction.

Specifically, the electrostatic chuck, for example, has internal chucking electrodes in a ceramic substrate (ceramic insulation plate). By use of electrostatic attraction generated through application of voltage to the chucking electrodes, the electrostatic chuck chucks the semiconductor wafer on the upper surface (first main surface or chucking surface) of the ceramic substrate. The electrostatic chuck is configured such that a base substrate (metal base) is bonded to the lower surface (second main surface or bonding surface) of the ceramic substrate.

Furthermore, a certain known electrostatic chuck has a function of adjusting (heating or cooling) the temperature of a semiconductor wafer chucked on the chucking surface. For example, according to a known technique, a heat-generating element (e.g., linear heat-generating conductor) is disposed in the ceramic substrate, and the heat-generating element heats the ceramic substrate to thereby heat the semiconductor wafer on the chucking surface. Also, according to another known technique, a cooling path is provided in the metal base for flowing cooling fluid therethrough to thereby cool the ceramic substrate.

Such an electrostatic chuck usually has, for example, lift pin holes formed therein for accommodating respective lift pins used to assist attachment and detachment of the semiconductor wafer, and a gas hole formed therein for supplying a heat transfer gas (backside gas) to an interface between the semiconductor wafer and the chucking surface of the electrostatic chuck.

Also, according to a recently developed ceramic heater, in order to accurately heat the electrostatic check, etc., the ceramic substrate is divided into a plurality of heating zones (heater zones). Specifically, a proposed ceramic heater has multiple zone heaters such that heating zones have respective heat-generating elements (zone heat-generating elements) capable of independently heating the heating zones, thereby enhancing the function of adjusting the temperature of the ceramic substrate (refer to Patent Documents 1 and 2).

RELATED ART DOCUMENTS

Patent Document 1 is Japanese Patent Application Laid-Open (kokai) No. 2002-93677.
Patent Document 2 is Japanese Patent Application Laid-Open (kokai) No. 2005-166354.

BRIEF SUMMARY OF THE INVENTION

However, for example, in the case of a ceramic heater for use in an electrostatic chuck in which a through hole, such as a lift pin hole or a gas hole, is formed within a heating zone (i.e., within a region where a zone heat-generating element is formed), as shown in FIG. 13A, a zone heat-generating element P2 (i.e., a heat-generating conductor P3 used to form the zone heat-generating element P2) for heating each heating zone P1 must be formed in such a manner as to detour around a through hole P4. More specifically, among parallel segments of the heat-generating conductor P3, heat-generating conductor segments P3$a$ which detour around the through hole P4 come closer to adjacent heat-generating conductor segments P3$b$.

Accordingly, since the spacing (pitch) between the heat-generating conductor segments P3$a$ disposed in parallel becomes small around the through hole P4, in some cases, a region of the small spacing and its periphery have a higher temperature as compared with other regions.

That is, the following problem has arisen. For example, in the case where the through hole P4 is formed within a certain heating zone P1, even though the certain heating zone P1 is heated under the same conditions as those of other heating zones P1 not having the through hole P4 (e.g., the same voltage and the same current are applied to the zone heat-generating elements P2), as shown in FIG. 13B, the ceramic heater has a nonuniform temperature distribution in the planar direction of the ceramic heater (in-plane temperature distribution).

Also, in the case of provision of a through hole in the metal base rather than in the ceramic substrate, since cooling by the metal base is not sufficient in a region of projection of the through hole on the ceramic substrate, the heat-generating conductor may be provided in such a manner as to detour around the region of projection. Even such a case involves the same problem of nonuniform in-plane temperature distribution of the ceramic heater.

The present invention has been conceived in view of the above problem, and an object of the invention is to provide a ceramic heater and an electrostatic chuck in which the in-plane temperature distribution of the ceramic heater can be made uniform.

(1) A ceramic heater of a first mode of the present invention has a plate-like form and comprises a laminate of a ceramic substrate and a base substrate. The ceramic substrate has an internal heat-generating element. The ceramic substrate has a hole and/or the base substrate has a through hole. In the ceramic heater as viewed in a thickness direction, the ceramic heater has heating zones and a hole region disposed within a certain one of the heating zones, the hole region corresponding to the hole or the through hole; the heat-generating element includes zone heat-generating elements disposed in respective heating zones so as to heat the ceramic substrate independently; and the zone heat-generating element disposed in the certain one of the heating zones having the hole region is formed of a linear heat-generating conductor which has parallel segments disposed in parallel, and turning-back segments which connect, while turning back, each parallel segment of the heat-generating conductor extending toward the hole region to an adjacent parallel segment of the heat-generating conductor so as to prevent the parallel segments extending toward the hole region from overlying the hole region.

As a modification, a ceramic heater of the first mode of the present invention has a plate-like form and comprises a ceramic substrate having an internal heat-generating element and defining a hole. In the ceramic heater as viewed in a thickness direction, the ceramic heater has heating zones and a hole region disposed within a certain one of the heating zones, the hole region corresponding to the hole defined by the ceramic substrate; the heat-generating element includes zone heat-generating elements disposed in respective heating zones so as to heat the ceramic substrate independently; and the zone heat-generating element disposed in the certain one of the heating zones having the hole region is formed of a linear heat-generating conductor which has parallel segments disposed in parallel and turning-back segments which connect, while turning back, each parallel segment of the heat-generating conductor extending toward the hole region to an adjacent parallel segment of the heat-generating conductor so as to prevent the parallel segments extending toward the hole region from overlying the hole region.

According to the first mode, in the ceramic heater as viewed in the thickness direction (hereinafter, may be referred to "as viewed in plane"), the zone heat-generating element disposed in the heating zone having the hole region has parallel segments of the linear heat-generating conductor disposed in parallel, and turning-back segments of the heat-generating conductor at which the parallel segments are turned back. The turning-back segments connect, while turning back, the parallel segments of the heat-generating conductor extending toward the hole region to their adjacent parallel segments of the heat-generating conductor so as to prevent the parallel segments extending toward the hole region from overlying the hole region.

A ceramic portion having the hole region such as a hole or a through hole differs from a surrounding ceramic portion in structure, material, etc.; accordingly, the ceramic portion having the hole region also differs from the surrounding ceramic portion in temperature distribution, potentially resulting in nonuniform temperature distribution in the planar direction of the ceramic heater (in-plane temperature distribution). Thus, in the first mode, the heat-generating conductor has the turning-back segments so as to prevent the parallel segments from overlying the hole region.

Specifically, according to the first mode, since the turning-back segments of the heat-generating conductor connect the parallel segments of the heat-generating conductor extending toward the hole region to other (adjacent) parallel segments of the heat-generating conductor; i.e., since the parallel segments of the heat-generating conductor extending toward the hole region are turned back before the hole region so as to avoid overlying the hole region, in contrast to a conventional practice, a reduction in the spacing (pitch) between the parallel segments of the heat-generating conductor can be avoided.

Thus, there can be restrained an excessive increase in temperature in the vicinity of the hole region as compared with temperature of a peripheral region, whereby the ceramic heater can have uniform in-plane temperature distribution.

For example, according to the first mode, even when the heating zone having the hole region and the heating zone not having the hole region are heated under the same conditions, since the heating zones show a similar change in temperature, the ceramic heater can yield a marked effect of readily having uniform in-plane temperature distribution.

In the case of forming the heat-generating conductor in such a manner as to detour around the through hole as in a conventional practice, the zone heat-generating element of the heating zone having the through hole becomes greater in length of the heat-generating conductor than the zone heat-generating element of the heating zone not having the through hole. Accordingly, the zone heat-generating element of the heating zone having the through hole increases in resistance, resulting in an increase in the difference in resistance between the zone heat-generating elements.

By contrast, in the case of provision of turning-back segments of the heat-generating conductor as in the case of the first mode, as compared with the conventional case, the difference in length of the heat-generating conductor of the zone heat-generating element can be reduced between the heating zone having the hole region and the heating zone not having the heating zone. Thus, the difference in resistance can be reduced between the zone heat-generating elements.

Thus, for example, in the ceramic heater having a plurality of heating zones disposed at a circumferentially uniform pitch (at the same central angle), when the same electric power (e.g., a predetermined voltage and a predetermined current) is applied to the zone heat-generating elements, the zone heat-generating elements can readily exhibit substantially the same temperature rise per unit time.

In controlling the heat-generating conditions of the zone heat-generating elements, as is well known, PID control parameters are adjusted (usually by trial and error) with respect to, for example, voltage to be applied so as to attain a uniform temperature rise per unit time. However, if the difference in resistance is large among the zone heat-generating elements, adjustment of the control parameters is not easy. By contrast, according to the first mode, since the resistance difference can be reduced among the zone heat-generating elements, the control parameters can be readily adjusted (i.e., temperature controllability can be improved).

Meanwhile, the term "hole region" means, as viewed in plane, a region in which a hole or a through hole exists (a region projected in the thickness direction of the ceramic heater) (the same also applies in the following description). The hole region to be disposed in the heating zone is disposed partially or entirely in the heating zone.

The expression "so as to prevent the parallel segments from overlying the hole region" means to prevent the parallel segments of the heat-generating conductor from overlying the hole region in the case where the parallel segments of the heat-generating conductor extend toward the hole region and would otherwise overlie the hole region.

(2) A ceramic heater of a second mode of the present invention has a plate-like form and comprises a laminate of a ceramic substrate and a base substrate. The ceramic substrate has an internal heat-generating element. The ceramic substrate has a hole and/or the base substrate has a through hole. In the ceramic heater as viewed in a thickness direction, the ceramic heater has heating zones and a hole region disposed between one heating zone and an adjacent heating zone, the hole region corresponding to the hole or the through hole; the heat-generating element includes zone heat-generating elements disposed in respective heating zones so as to heat the ceramic substrate independently, each zone heat-generating element formed of a linear heat-generating conductor having parallel segments disposed in parallel, the parallel segments of the heat-generating conductor extending toward the adjacent heating zone and turned back before the adjacent heating zone with a first parallel segment extending toward the hole region and turned back before the hole region to form a first turning-back segment of the heat-generating conductor, and at least a portion of the first turning-back segment recessed in a direction opposite the adjacent heating zone to a greater extent than (a) a second turning-back segment of the heat-generating conductor formed by turning back a second parallel segment extending in such a direction as not to overlie the hole region, or (b) an end of a third parallel segment extending in such a direction as not to overlie the hole region.

As a modification, a ceramic heater of the second mode of the present invention has a plate-like form and comprises a ceramic substrate having an internal heat-generating element and defining a hole. In the ceramic heater as viewed in a thickness direction, the ceramic heater has heating zones and a hole region disposed between one heating zone and an adjacent heating zone, the hole region corresponding to the hole defined by the ceramic substrate; the heat-generating element includes zone heat-generating elements disposed in respective heating zones so as to heat the ceramic substrate independently, each zone heat-generating element formed of a linear heat-generating conductor having parallel segments disposed in parallel, the parallel segments of the heat-generating conductor extending toward the adjacent heating zone and turned back before the adjacent heating zone with a first parallel segment extending toward the hole region and turned back before the hole region to form a first turning-back segment of the heat-generating conductor and at least a portion of the first turning-back segment recessed in a direction away from the adjacent heating zone to a greater extent than (a) a second turning-back segment of the heat-generating conductor formed by turning back a second parallel segment extending in such a direction as not to overlie the hole region, or (b) an end of a third parallel segment extending in such a direction as not to overlie the hole region.

According to the second mode, in the ceramic heater as viewed in the thickness direction (as viewed in plane), the hole region is disposed between the zone heat-generating elements of the heating zones adjacent to each other. Also, the parallel segments of the heat-generating conductor of the zone heat-generating element extend toward the adjacent heating zone. The heat-generating conductor has the first turning-back segment and the second turning-back segment or the end (an end, located toward the adjacent heating zone, of the parallel segment extending in such a direction as not to overlie the hole region).

The first turning-back segment and the second turning-back segment or the end differ in the position of turning back or the position of disposition. Specifically, at least a portion of the first turning-back segment is recessed to a greater extent in the direction opposite the adjacent heating zone than is the second turning-back segment. Alternatively, at least a portion of the first turning-back segment is recessed to a greater extent in the direction opposite the adjacent heating zone than is the end. That is, as compared with the second turning-back segment or the end, the first turning-back segment is located more inward (toward the turning-back side) in the heating zone where the same exists.

Since a ceramic region having the hole region such as a hole or a through hole differs from a peripheral ceramic region in structure, material, etc., the ceramic region having the hole region differs in temperature distribution from the peripheral ceramic region; as a result, the in-plane temperature distribution of the ceramic heater is apt to become nonuniform. Thus, according to the second mode, first, the heat-generating conductor has the first turning-back segment so as not to overlie the hole region.

Specifically, according to the second mode, in order to avoid overlying the hole region, the heat-generating conductor extending toward the hole region is turned back before the hole region to thereby form the first turning-back segment. Thus, a reduction in the spacing (pitch) between the parallel segments of the heat-generating conductor can be avoided.

Thus, there can be restrained an excessive increase in temperature of and in the vicinity of the hole region as compared with temperature of a peripheral region, whereby the ceramic heater can have uniform in-plane temperature distribution.

Also, in the case of provision of the hole region between the zone heat-generating elements of the adjacent heating zones, employment of a wide space between the zone heat-generating elements potentially results in an excessive drop in temperature of the space between the zone heat-generating elements.

By contrast, according to the second embodiment, in the case of provision of the hole region between the zone heat-generating elements of the adjacent heating zones, at least a portion of the first turning-back segment at which the parallel segment extending toward the hole region is turned back is recessed to a greater extent in the direction opposite the adjacent heating zone than is the second turning-back segment at which the parallel segment extending in such a direction as not to overlie the hole region is turned back, or than is the end, located toward the adjacent heating zone, of the parallel segment extending in such a direction as not to overlie the hole region.

That is, at least a portion of the first turning-back segment is recessed toward the inward side of the heating zone so as not to overlie the hole region (i.e., so as to avoid overlying the hole region). Thus, even in the case of provision of the hole region between the zone heat-generating elements, there is no need to excessively widen a space between the zone heat-generating elements; thus, the ceramic heater can have uniform in-plane temperature distribution.

Furthermore, according to the second mode, in the case of provision of the hole region between the zone heat-generating elements, since the heat-generating conductors are formed (disposed) accordingly, as compared with the case of provision of the entire hole region within the heating zone, a geometric difference can be reduced between the heat-generating conductors of the zone heat-generating elements. For example, a difference in length can be reduced between the heat-generating conductors. Thus, since a difference in resistance of the zone heat-generating element can be reduced between the heating zone having the hole region and the heating zone not having the hole region, as mentioned above, the control parameters can be readily adjusted.

Particularly, in the case where the adjacent zone heat-generating elements are to be formed in such a manner as to avoid overlying the hole region located therebetween; i.e., in the case of adjusting the lengths of the heat-generating conductors of the two zone heat-generating elements, a difference in resistance between the two zone heat-generating elements can be greatly reduced as compared with the case of deforming only one of the two zone heat-generating elements. That is, since overlying the hole region can be avoided through slight deformation of the two zone heat-generating elements, a difference in resistance can be further reduced between the two zone heat-generating elements. Thus, the control parameters can be more readily adjusted.

The expression "such a direction as not to overlie the hole region" means a direction along which, in the case of disposition of the hole region corresponding to a hole or a through hole between the zone heat-generating elements of the adjacent heating zones, the heat-generating conductor is extended toward the adjacent heating zone without overlying the hole region.

(3) A ceramic heater of a third mode of the present invention is characterized in that the turning-back segment of the heat-generating conductor turned back before the hole region extends along the circumference of the hole region.

For example, in the case of a circular hole region, the turning-back segment of the heat-generating conductor can employ a shape extending along the circumference of the circle such as a similar arc.

Through employment of such a shape, the in-plane temperature distribution can be made uniform to a higher degree of reliability.

(4) An electrostatic chuck of a fourth mode of the present invention comprises the ceramic heater according to any one of the first to third modes. In the electrostatic chuck, the base substrate is a metal base, and the ceramic substrate has chucking electrodes for chucking an object to be chucked.

The fourth mode exemplifies the configuration of the electrostatic chuck.

(5) An electrostatic chuck of a fifth mode of the present invention is characterized in that the base substrate has a cooling path for flowing cooling fluid therethrough.

According to the fifth mode, since the base substrate has the cooling path, the ceramic substrate (accordingly, an object to be chucked) can be cooled.

Next, configurational features of the present invention will be described.

The ceramic heater and the electrostatic chuck can employ circular outlines as viewed in plane.

The hole can be a through hole or a recess (which opens to either side of the ceramic heater with respect to the thickness direction). Examples of the hole include through holes which extend through the ceramic substrate, through the base substrate, and through the electrostatic chuck, respectively, in the thickness direction, as well as a recess in the surface of the ceramic substrate (e.g., a recess which opens toward the base substrate). Also, examples of the hole include lift pin holes, gas holes, and holes for supply of electricity to the chucking electrodes or to the zone heat-generating elements.

The laminate can employ a configuration in which the metal plate (metal base) or the like is bonded to the ceramic substrate.

In the ceramic heater as viewed in the thickness direction (as viewed in plane), a plurality of the heating zones can be disposed annularly. Also, as viewed in plane, the heating zones can be disposed at uniform pitch. Furthermore, as viewed in plane, the heating zones can be disposed in concentric rows.

The heat-generating conductor can have parallel segments.

No particular limitation is imposed on conductors used to form the heat-generating elements (accordingly, the zone heat-generating elements and the heat-generating conductors) and the chucking electrodes. However, in the case of employment of a simultaneous firing process for forming the conductors and the ceramic substrate, metal powder contained in the conductors must have a melting point higher than a firing temperature for the ceramic substrate.

For example, in the case of the ceramic substrate formed of a so-called high-temperature-fired ceramic (e.g., alumina), metal powder contained in the conductors can be of nickel (Ni), tungsten (W), molybdenum (Mo), manganese (Mn), etc., and alloys thereof. In the case of the ceramic substrate formed of a so-called low-temperature-fired ceramic (e.g., glass ceramic), metal powder contained in the conductors can be of copper (Cu), silver (Ag), etc., and alloys thereof. Also, in the case of the ceramic substrate formed of a high-dielectric-constant ceramic (e.g., barium titanate), metal powder contained in the conductors can be of nickel (Ni), copper (Cu), silver (Ag), palladium (Pd), platinum (Pt), etc., and alloys thereof.

The zone heat-generating elements and the chucking electrodes are formed through application of a metal-powder-containing conductor paste by a conventionally known method such as a printing process, followed by firing.

The ceramic substrate (individual ceramic layers in the case of the ceramic substrate composed thereof) is formed of, for example, a sintered body which predominantly contains a high-temperature-fired ceramic such as alumina, yttria (yttrium oxide), aluminum nitride, boron nitride, silicon carbide, or silicon nitride. Alternatively, the ceramic substrate may be formed of a sintered body which predominantly contains a low-temperature-fired ceramic such as a glass ceramic formed by adding an inorganic filler such as alumina to borosilicate glass or lead borosilicate glass, or may be formed of a sintered body which predominantly contains a dielectric ceramic such as barium titanate, lead titanate, or strontium titanate.

In semiconductor fabrication, various processes such as dry etching employ various techniques which use plasma. Processes which use plasma heavily use corrosive gas such as halogen gas. Thus, the electrostatic chuck, which is exposed to corrosive gas and plasma, is required to have high corrosion resistance. Therefore, preferably, the ceramic substrate is formed of a material which is corrosion-resistant to corrosive gas and plasma; for example, a material which predominantly contains alumina or yttria.

The electrostatic chuck can employ a configuration in which the plate-like metal base is bonded through a bonding-agent layer to the second main surface opposite the first main surface (to which an object to be chucked is chucked) of the ceramic substrate. Also, preferably, the ceramic substrate assumes the form of a laminate of a plurality of ceramic layers, since various structures can be formed therein. The ceramic substrate used in the electrostatic chuck is an electrically insulating ceramic insulation plate.

Examples of the base substrate include a metal base. In the case of employment of the metal base, example materials for the metal base include copper, aluminum, iron, and titanium. In the case of bonding the metal base to the ceramic substrate through a bonding-agent layer, preferably, material for the bonding agent has a high strength of bonding the ceramic substrate and the metal base. Examples of such material include a metal material such as indium, and resin materials such as silicone resin, acrylic resin, epoxy resin, polyimide resin, polyamide-imide resin, and polyamide resin. However, because of a large difference in thermal expansion coefficient between the ceramic substrate and the metal base, particularly preferably, the bonding agent is formed of a resin material, which is elastically deformable and thus functions as a buffer material.

Example fluids to be flowed through the cooling path include a fluorine-containing inert fluid.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

Modes (embodiments) for carrying out the present invention will next be described.

A. First Embodiment

Figure 1:
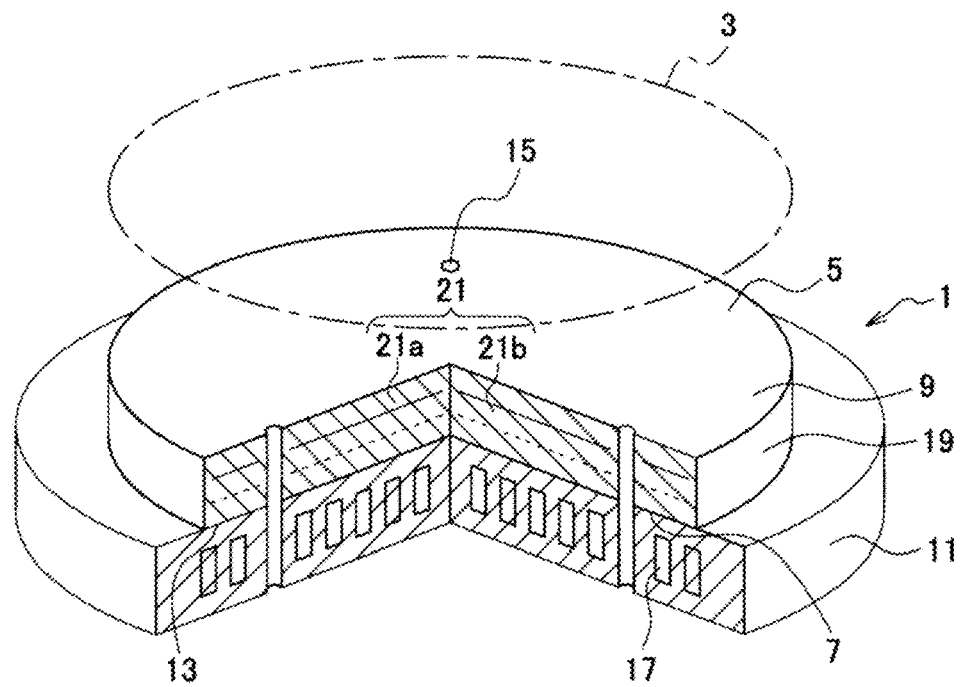
FIG. 1 is a partially cutaway perspective view showing an electrostatic chuck of a first embodiment of the present invention.

The following embodiments will be described while referring to an electrostatic chuck capable of chucking and holding, for example, a semiconductor wafer.

a) First, the Structure of an Electrostatic Chuck 1 of a First Embodiment of the Present Invention is Described As shown in FIG. 1, the electrostatic chuck 1 of the present embodiment is adapted to chuck a semiconductor wafer 3 at the upper side thereof in FIG. 1. The electrostatic chuck 1 is configured such that a disk-like metal base (cooling plate) 11 and a disk-like ceramic heater 9 having a first main surface (chucking surface) 5 and a second main surface 7 are bonded (laminated) through a bonding layer 13 (see FIG. 2) formed of, for example, indium.

The electrostatic chuck 1 has a plurality of lift pin holes 15 formed in such a manner as to extend therethrough in the thickness direction. Lift pins (not shown) are inserted into the respective lift pin holes 15. The lift pin holes 15, which are through holes, also serve as flow paths (cooling gas holes) for cooling gas supplied toward the chucking surface 5 side for cooling the semiconductor wafer 3. The cooling gas holes may be provided separately from the lift pin holes 15. Examples of the cooling gas include inert gas such as helium gas and nitrogen gas.

Furthermore, a cooling path 17 is provided in the metal base 11 for flowing cooling fluid therethrough in order to cool the ceramic heater 9 (accordingly, the semiconductor wafer 3). The metal base 11 is formed of aluminum or an aluminum alloy, and examples of the cooling fluid include a cooling liquid such as a fluorine-containing liquid or pure water.

b) Next, the Internal Structure of the Ceramic Heater 9 is Described.

Figure 2:
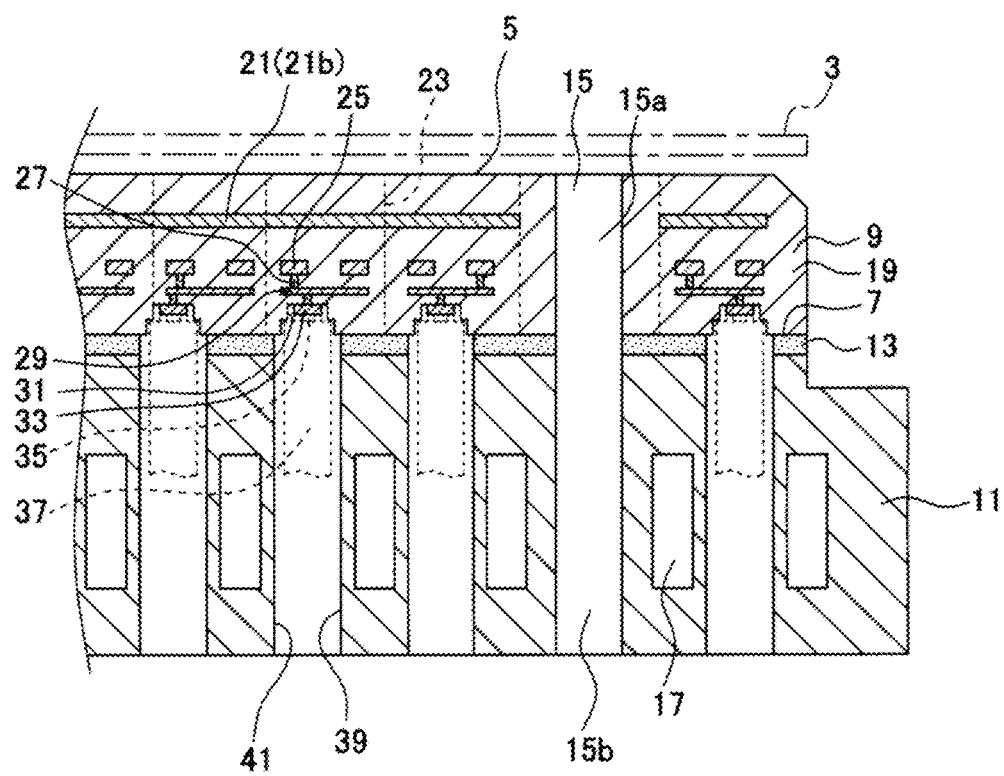
FIG. 2 is an explanatory view showing, on an enlarged scale, a portion of the electrostatic chuck of the first embodiment sectioned along the thickness direction.

As shown in FIG. 2, the ceramic heater 9 includes a ceramic substrate 19 having heat-generating elements, etc., to be described later.

The ceramic substrate 19 is a laminate of a plurality of ceramic layers (not shown) and is an alumina-based sintered body which predominantly contains alumina. The alumina-based sintered body is an insulator (dielectric).

The ceramic substrate 19 has a pair of chucking electrodes 21, which will be described later, provided under the chucking surface 5 (FIG. 2). Furthermore, the ceramic substrate 19 has zone heat-generating elements 25 provided under the chucking electrodes 21 and disposed in respective heating zones 23, which will be described later.

Also, the ceramic substrate 19 has vias 27 and an inner conductor layer 29 provided therein. The ceramic substrate 19 also has recesses 31 (holes) provided at the second main surface 7 side, and metallization layers 33 and inner connection terminals 35 are provided in the respective recesses 31. Thus, the chucking electrodes 21 and the zone heat-generating elements 25 are connected to electricity supply terminal pins 37 through the vias 27, the inner conductor layer 29, the metallization layers 33, the inner connection terminals 35, etc. FIG. 2 does not show configurational details of electricity supply to the chucking electrodes 21.

The recesses 31 communicate with respective through holes 39 which extend through the metal base 11 in the thickness direction. The recesses 31 and the through holes 39 constitute top-closed (in FIG. 2) communication portions 41. The terminal pins 37 are disposed in the respective communication portions 41.

Each lift pin hole 15 is a through hole consisting of a first through hole 15a extending through the ceramic substrate 19 in the thickness direction and a second through hole 15b extending through the metal base 11 in the thickness direction. The first through hole 15*a* and the second through hole 15*b* communicate with each other in the axial direction.

Configurational details of the ceramic heater 9 will next be described.

Chucking Electrode 21

The chucking electrode 21 is composed of a pair of electrodes 21*a* and 21*b* each having, for example, a semicircular shape as viewed in plane (see FIG. 1). In use of the electrostatic chuck 1, the chucking electrode 21 fixedly chucks the semiconductor wafer 3 by use of electrostatic attraction (chucking force) generated by applying a DC high voltage between the electrodes 21*a* and 21*b*. The chucking electrode 21 can employ other well-known various configurations.

Heating Zone 23

Figure 3:
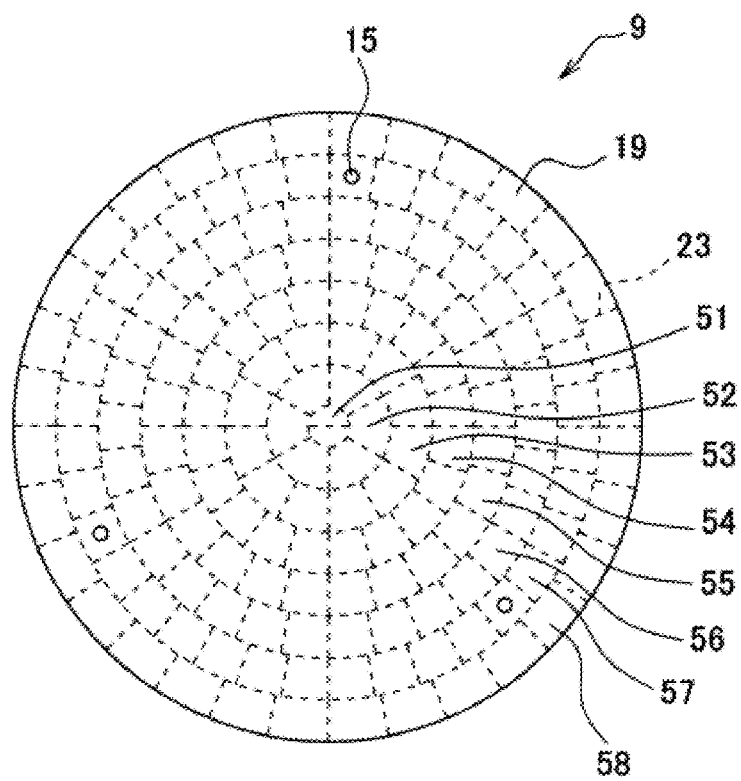
FIG. 3 is a plan view showing the disposition of heating zones of a ceramic heater of the first embodiment.

As shown in FIG. 3, the ceramic heater 9 (accordingly, the ceramic substrate 19) has a plurality of the heating zones 23 as viewed in plane so as to heat (thus, to adjust temperature of) respective planar regions thereof.

Specifically, as viewed in plane, the ceramic heater 9 has eight heating-zone regions, namely, in the radially outward direction from the center (toward the circumference), first, second, third, fourth, fifth, sixth, seventh, and eighth heating-zone regions 51, 52, 53, 54, 55, 56, 57, and 58. That is, the ceramic heater 9 has the first to eighth heating-zone regions 51 to 58 each consisting of the heating zone(s) 23.

As viewed in plane, the central first heating-zone region 51 in which the center axis exists has a circular shape, whereas the second to eighth heating-zone regions 52 to 58 disposed around the first heating-zone region 51 have annular shapes having a predetermined width and are disposed concentrically.

Also, the second heating-zone region 52 is divided into six heating zones 23 at the same central angle (at uniform pitch); the third heating-zone region 53 is divided into 12 heating zones 23 at uniform pitch; the fourth heating-zone region 54 is divided into 20 heating zones 23 at uniform pitch; the fifth heating-zone region 55 is divided into 24 heating zones 23 at uniform pitch; the sixth heating-zone region 56 is divided into 30 heating zones 23 at uniform pitch; the seventh heating-zone region 57 is divided into 36 heating zones 23 at uniform pitch; and the eighth heating-zone region 58 is divided into 32 heating zones 23 at uniform pitch.

Thus, each heating zone 32 in the second to eighth heating-zone regions 52 to 58 has an arc shape having a predetermined width (fanwise shape having a predetermined width). However, the first heating-zone region 51 is formed of a single heating zone 23, and the heating zone 23 has a circular shape. The broken lines in FIG. 3 show boundaries between the heating zones 23.

Each of the three lift pin holes 15 corresponds to a hole region A (see FIG. 4), and the three lift pin holes 15 are provided in the three heating zones 23, respectively, in the seventh heating-zone region 57. That is, the lift pin holes 15 are provided at uniform pitch; specifically, at a central angle of 120 degrees.

Zone Heat-Generating Element 25

Figure 4:
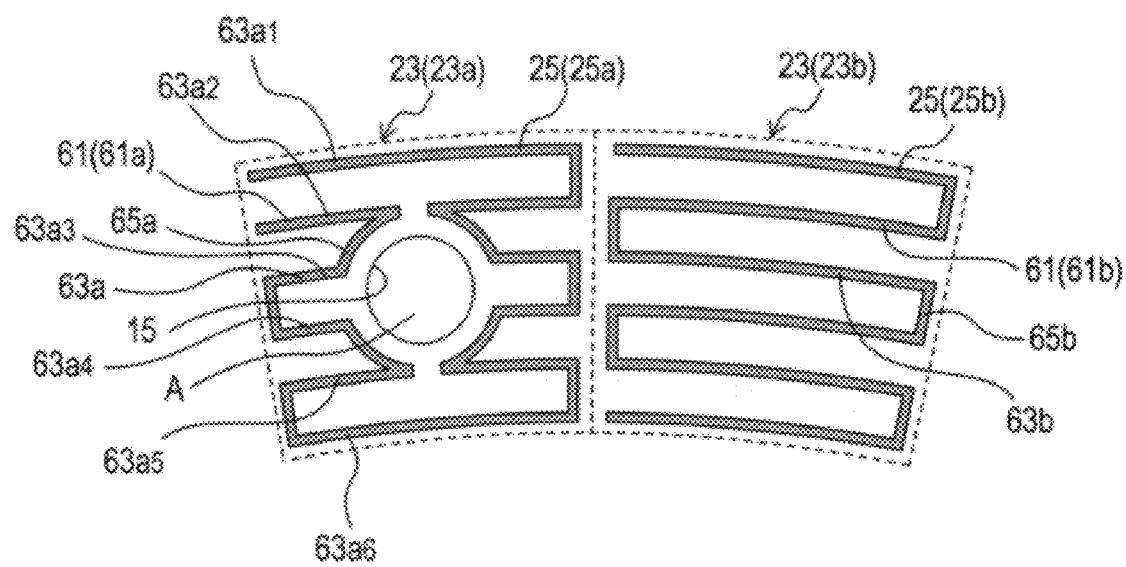
FIG. 4 is a plan view showing a part of zone heat-generating elements of the ceramic heater of the first embodiment.

As shown in FIG. 4, the zone heat-generating element 25 formed of a linear (specifically, a strip having a predetermined width) heat-generating conductor 61 is disposed in each heating zone 23 in the first to eighth heating-zone regions 51 to 58.

The zone heat-generating element 25 is formed of a metal material (W or the like) which generates heat when current flows therethrough upon application of voltage thereto.

In order to heat the heating zone 23 uniformly to a possible extent, the zone heat-generating element 25 is disposed in an approximately fanwise shape substantially similar to that of the heating zone 23 by meandering the heat-generating conductor 61. In other words, the zone heat-generating element 25 is disposed at predetermined meandering pitch spacings in such a manner as to cover substantially the entire strip-like, fanwise heating zone 23.

More specifically, in a heating zone 23*b*, or the heating zone 23 in which a through hole (hole region A); specifically, the lift pin hole 15, does not exist (the right-hand heating zone in FIG. 4), a linear heat-generating conductor 61*b* is disposed in such a manner as to extend along concentric arcs (parallel arcs) centered at the center axis of the ceramic heater 9. Also, as shown in FIG. 4, the linear heat-generating conductor 61*b* is meandered in such a manner as to be turned back leftward or rightward at an end (circumferential end) of a parallel segment 63*b* thereof through a turning-back segment 65*b*.

In a heating zone 23*a*, or the heating zone 23 in which the hole region A exists (the left-hand heating zone in FIG. 4), a heat-generating conductor 61*a* is formed basically in a manner similar to that of the heat-generating conductor 61*b* in the heating zone 23*b* having no hole region A, but differs in disposition geometry around the hole region A.

Specifically, a zone heat-generating element 25*a* in the heating zone 23*a* having the hole region A is formed of the heat-generating conductor 61*a* which has parallel segments 63*a* (parallel segments 63*a*1 to 63*a*6) and turning-back segments 65*a* for connecting ends of the adjacent parallel segments 63*a* (ends of the parallel segments 63*a*2 and 63*a*3, and ends of the parallel segments 63*a*4 and 63*a*5) in the vicinity of the hole region A. That is, in order to prevent the parallel segment 63*a* (parallel segment 63*a*3 or 63*a*4) of the heat-generating conductor 61*a* extending toward the hole region A from overlying the hole region A, the turning-back segment 65*a* is connected, while turning back, to the adjacent parallel segment 63*a* (parallel segment 63*a*2 or 63*a*5) of the heat-generating conductor 61*a*.

More specifically, among the circumferentially extending parallel segments 63*a* (parallel segments 63*a*1 to 63*a*6) of the heat-generating conductor 61*a*, the parallel segments 63*a* which would otherwise overlie the hole zone A (parallel segments 63*a*3 and 63*a*4) are bent (for example, in a straight or curved line) before the hole region A and connected to the adjacent parallel segments 63*a* (parallel segments 63*a*2 and 63*a*5).

Also, since the hole region A is circular as viewed in plane, the turning-back segment 65*a* is curved in an arc-like manner along the outline of the hole region A.

Since the heat-generating conductor 61*a* in the heating zone 23*a* having the hole region A is slightly smaller in length than the heat-generating conductor 61*b* in the heating zone 23*b* having no hole region A, the zone heat-generating element 25*a* in the heating zone 23*a* having the hole region A is slightly smaller in resistance than a zone heat-generating element 25*b* in the heating zone 23*b* having no hole region A. However, the heat-generating conductors 61*a* and 61*b* may be adjusted so as to have the same length.

c) Next, a Method of Manufacturing the Electrostatic Chuck 1 of the First Embodiment Will be Briefly Described (1) Material for the ceramic substrate 19 is prepared. Specifically, 92% by weight $Al_2O_3$ (main component) powder, 1% by weight MgO powder, 1% by weight CaO powder, and 6% by weight SiO$_2$ powder are mixed. The resultant mixture is wet-pulverized in a ball mill for 50 to 80 hours, followed by dehydration and drying.

(2) Next, to the resultant powder, solvent, etc., are added; then, the resultant mixture is mixed in a ball mill, thereby yielding slurry.

(3) Next, the slurry is defoamed under reduced pressure and is then poured onto a flat plate, followed by slow cooling to allow solvent to evaporate. By this procedure, alumina green sheets (corresponding to ceramic layers) are formed.

Then, holes which are to become the lift pin holes 15 and the recesses 31, and through holes which are to become the vias 27 are formed in the alumina green sheets at required positions.

(4) Also, tungsten powder is mixed into the material powder for the alumina green sheet. The resultant mixture is slurried, thereby yielding metallization ink.

(5) Then, in order to form the chucking electrodes 21, the zone heat-generating elements 25, and the inner conductor layer 29, by use of the metallization ink, corresponding patterns are printed, by a usual screen printing process, on corresponding alumina green sheets at corresponding positions. In order to form the vias 27, the metallization ink is charged into the through holes.

(6) Next, the alumina green sheets are aligned with one another in such a manner as to form holes which are to become the lift pin holes 15, etc., followed by thermal compression bonding to yield a laminate sheet.

(7) Next, the laminate sheet formed by thermal compression bonding is cut into a predetermined disk-like shape.

(8) Next, the disk-like sheet is fired (regular firing) at a temperature of 1,400° C. to 1,600° C. (e.g., 1,550° C.) for five hours in a reducing atmosphere, thereby yielding an alumina-based sintered body.

(9) After the firing, the alumina-based sintered body is machined as appropriate for dimensional adjustment. Thus, the ceramic substrate 19 is yielded.

(10) Next, the metallization layers 33 and the inner connection terminals 35 are provided in the ceramic substrate 19.

(11) Next, by use of, for example, indium, the ceramic substrate 19 (i.e., the ceramic heater 9) and the metal base 11 are bonded together. Thus, the electrostatic chuck 1 is completed.

d) Next, the Effects of the First Embodiment Will be Described

According to the first embodiment, as viewed in plane, in the heating zone 23$a$ having the hole region A, the heat-generating conductor 61$a$ has the turning-back segments 65$a$ so as not to overlie the hole region A. That is, a parallel segment of the heat-generating conductor 61$a$ extending toward the hole region A is bent at the turning-back segment 65$a$ toward an adjacent parallel segment of the heat-generating conductor 61$a$ and is connected to the adjacent parallel segment.

Thus, in contrast to conventional practice, a reduction in the spacing (pitch) between the parallel segments of the heat-generating conductor 61$a$ can be avoided. Accordingly, there can be restrained an excessive increase in temperature in the vicinity of the hole region A as compared with temperature of a peripheral region, whereby the ceramic heater 9 can have uniform in-plane temperature distribution.

Thus, even when the heating zone 23$a$ having the hole region A and the heating zone 23$b$ having no hole region A are heated under similar conditions by the zone heat-generating elements 25$a$ and 25$b$, respectively, since the heating zones 23$a$ and 23$b$ change their temperatures similarly, the ceramic heater 9 can yield a marked effect of readily having uniform in-plane temperature distribution.

Also, according to the first embodiment, as mentioned above, by virtue of the heat-generating conductor 61$a$ having the turning-back segments 65$a$, as compared with conventional embodiments, a difference in length is small between the heat-generating conductors 61$a$ and 61$b$ of the zone heat-generating element 25$a$ of the heating zone 23$a$ having the hole region A and the zone heat-generating element 25$b$ of the heating zone 23$b$ having no hole region A, respectively. Therefore, a difference in resistance can be reduced between the zone heat-generating elements 25$a$ and 25$b$.

Thus, in the ceramic heater 9 having a plurality of the heating zones 23 disposed at circumferentially uniform pitch, the zone heat-generating elements 25 to which the same electric power is applied can readily exhibit a similar temperature rise per unit time.

That is, the first embodiment has the following advantage: since a difference in resistance can be reduced among the zone heat-generating elements 25, control parameters can be readily adjusted (i.e., temperature controllability can be improved).

Furthermore, the first embodiment has the following advantage: since the turning-back segments 65$a$ of the heat-generating conductor 61 located toward the hole region A have a shape (arc shape) along the circumference of the circular hole region A, in-plane temperature distribution can be made uniform to a higher degree of reliability.

e) Next, Examples of Experiment Conducted to Verify the Effect of the First Embodiment Will be Described

First Example of Experiment

Figure 5A:
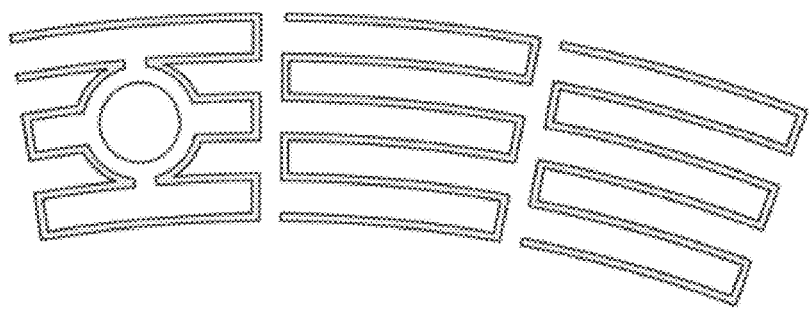
FIG. 5A is a plan view showing the zone heat-generating elements of a ceramic heater used in the first example of experiment.

The first example of experiment has computer-simulated how temperature in the periphery of the hole region changes when a predetermined voltage is applied to the zone heat-generating elements of three heating zones disposed circumferentially in the seventh heating-zone region of the ceramic heater of the first embodiment as shown in FIG. 5A.

A model for experimental use has a configuration basically similar to that of the first embodiment described above. Of the three heating zones in FIG. 5A, the leftmost heating zone has a through hole (hole region A), and the other two heating zones do not have the hole region A.

Specifically, the employed ceramic heater had the following specifications. The heat-generating conductors are disposed similarly to the case of the first embodiment (see FIG. 5A).

Material for ceramic substrate: alumina
Material for zone heat-generating element: W
Heating zone: width 68 mm to 80 mm, central angle 10°
Zone heat-generating element: width 69 mm to 79 mm, central angle 10°
(The center line of the zone heat-generating element is 1 mm offset from the width of the heating zone.)
Heat-generating conductor: line width 0.4 mm
Hole region (through hole): diameter 4.4 mm
Heating conditions were as follows.
Voltage applied to zone heat-generating elements: 20 V
Time of application: 40 sec FIG. 5B shows temperature distribution of the above-mentioned model heated under the above-mentioned conditions.

Figure 5B:
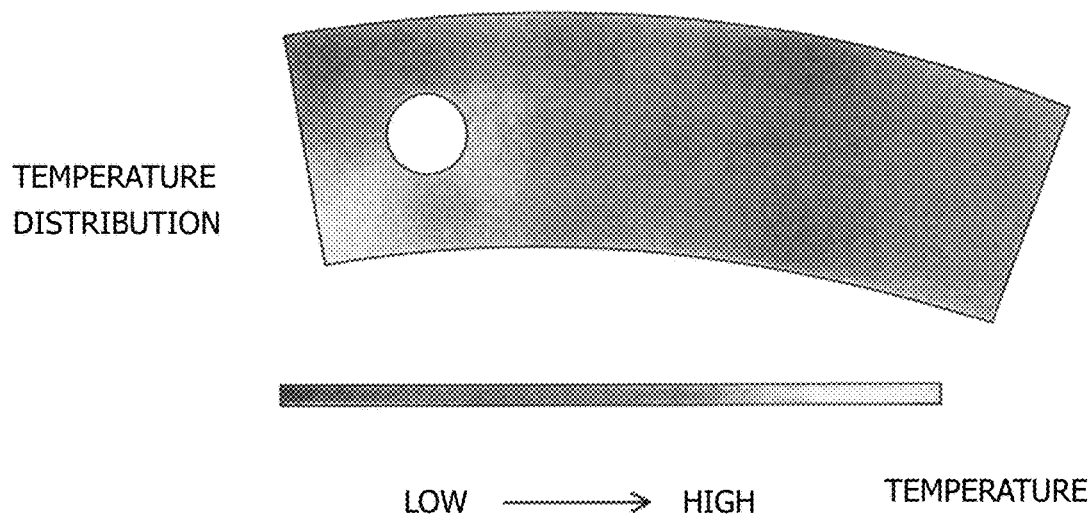
FIG. 5B is an explanatory view showing the condition of heat generation of the heating zones in the first example of experiment.

As shown in FIG. 5B, in the model having the configuration of the first embodiment, a temperature difference is small among the periphery of the hole region A and the heating zones, indicating that the ceramic heater can have favorably uniform in-plane temperature distribution.

Figure 13A:
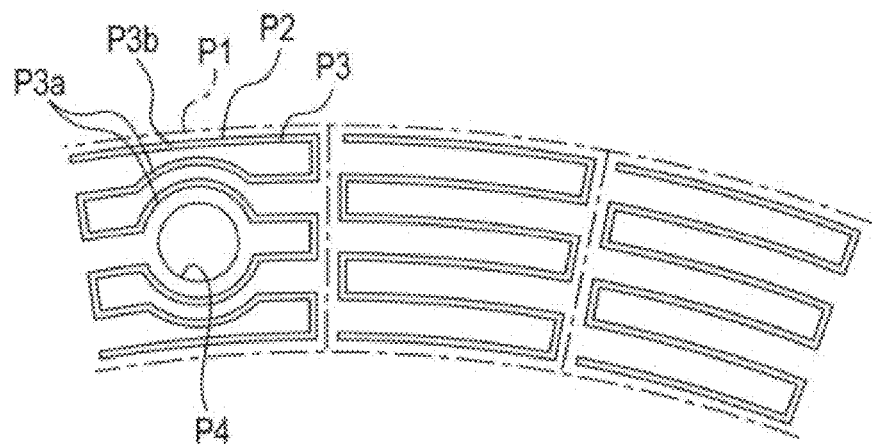
FIG. 13A is a plan view showing zone heat-generating elements of a conventional ceramic heater.
Figure 13B:
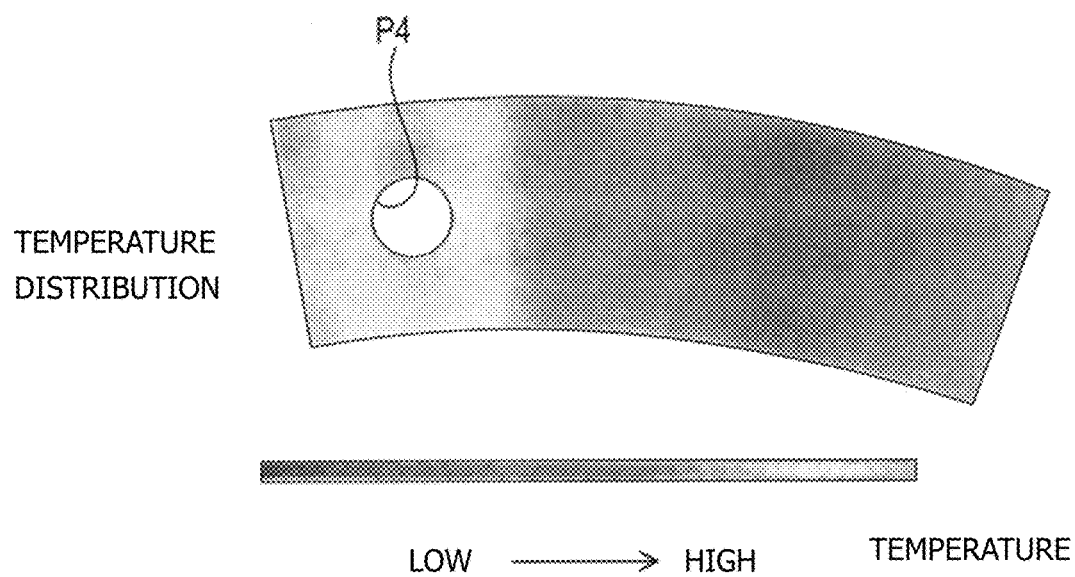
FIG. 13B is an explanatory view showing the condition of heat generation of heating zones of the conventional ceramic heater.

In the model of the comparative example shown in FIG. 13A, heating was performed under the same conditions. As shown in FIG. 13B, a temperature difference is large among the heating zones, indicating that the ceramic heater fails to have favorably uniform in-plane temperature distribution. The model of the comparative example is similar to the model of the above-mentioned first example of experiment except that in the heating zone having the hole region A, the heat-generating conductor is provided in such a manner as to detour around the hole region A.

Second Example of Experiment

The second example of experiment examined the heating zone having no hole region A (through hole) and the heating zone having the hole region A (through hole) for the degree of temperature rise.

Specifically, in the model of the first example of experiment mentioned above, the heating zones were examined for temperature variation through application of a predetermined voltage (e.g., 20 V) to the respective zone heat-generating elements.

Temperature was measured at similar positions of the heating zones (e.g., corners such as upper right corners in FIG. 5A).

Figure 6:
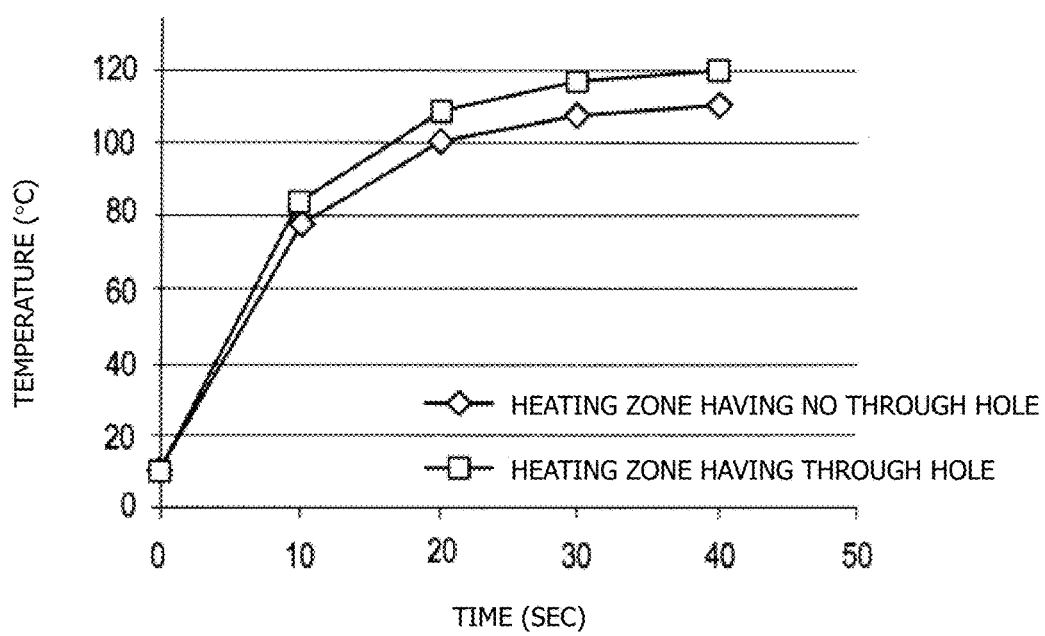
FIG. 6 is a graph showing variation in temperature rise in the ceramic heater of the second example of experiment.

FIG. 6 shows the results of the experiment. As is apparent from FIG. 6, in the case of the model of the first embodiment, the heating zone having no hole region A and the heating zone having the hole region A exhibit substantially the same temperature rise, indicating that the heating zones reach substantially similar temperature in substantially similar time.

B. Second Embodiment

Next, a second embodiment of the present invention will be described; however, description of structural features similar to those of the first embodiment is omitted.

Members similar to those of the first embodiment are denoted by the same reference numerals as those of the first embodiment.

a) First, the Structure of an Electrostatic Chuck of the Second Embodiment is Described.

Figure 7:
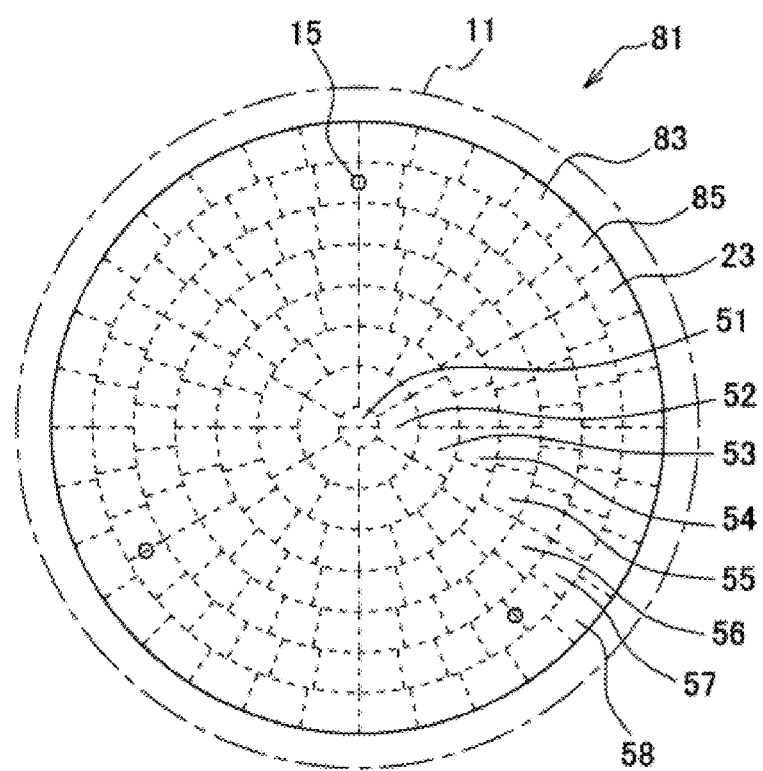
FIG. 7 is a plan view showing the disposition of heating zones of a ceramic heater of a second embodiment of the present invention.

As shown in FIG. 7, similar to the first embodiment, an electrostatic chuck 81 of the second embodiment is configured such that a ceramic heater 83 (accordingly, a ceramic substrate 85) is bonded to the metal base 11.

Similar to the first embodiment, the ceramic heater 83 has the first to eighth heating-zone regions 51 to 58 each consisting of one or a plurality of the heating zones 23.

In contrast to the first embodiment, the lift pin holes 15 are not provided in the respective heating zones 23, but are provided at uniform pitch (120 degrees) in the seventh heating-zone region 57 between the circumferentially adjacent heating zones 23.

Figure 8:
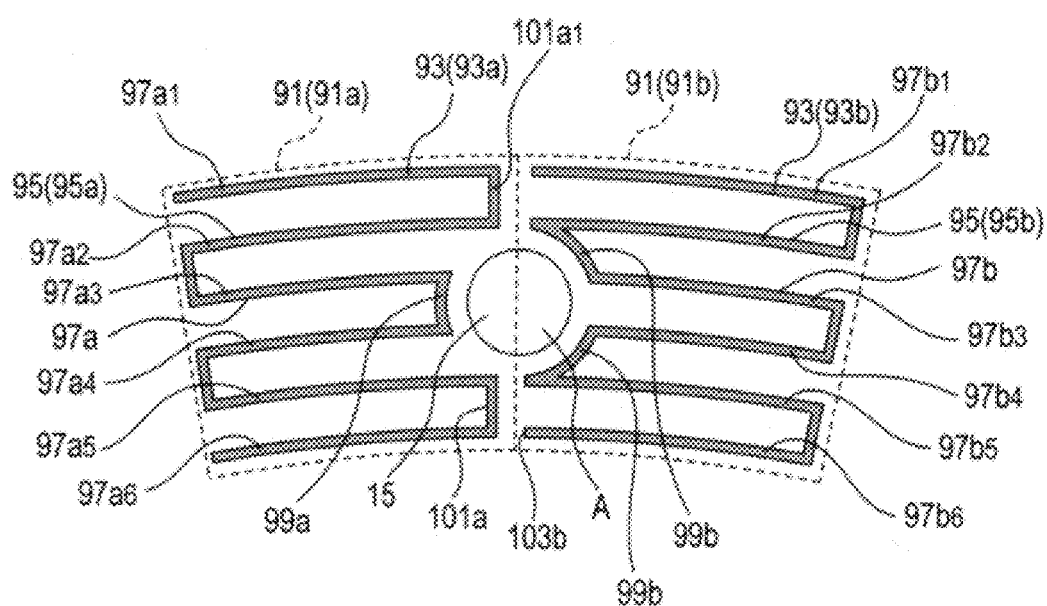
FIG. 8 is a plan view showing a part of zone heat-generating elements of the ceramic heater of the second embodiment.

That is, as shown in FIG. 8, the circular hole region A, which is the lift pin hole 15 in the form of a through hole, is provided between a zone heat-generating element 93 (first zone heat-generating element 93a) of one heating zone 91 (first heating zone 91a) and a zone heat-generating element 93 (second zone heat-generating element 93b) of the other adjacent heating zone 91 (second heating zone 91b).

As viewed in plane, the heating zones 91 have the respective zone heat-generating elements 93 disposed therein, and the zone heat-generating elements 93 are formed of respective linear heat-generating conductors 95 (first heat-generating conductor 95a and second heat-generating conductor 95b) each having a predetermined width and are disposed in a fanwise shape corresponding to the shape of each heating zone 91.

The first zone heat-generating element 93a is formed of the first heat-generating conductor 95a having parallel segments 97a (parallel segments 97a1 to 97a6). Also, the parallel segments 97a of the first heat-generating conductor 95a are disposed in such a manner as to extend toward the adjacent second heating zone 91b and to turn back (toward the opposite side) before the adjacent second heating zone 91b.

More specifically, of the parallel segments 97a, radially (in FIG. 8, vertically) central two parallel segments 97a3 and 97a4 extending toward the hole region A are connected to each other in such a manner as to be turned back at a first turning-back segment 99a in order to avoid overlying the hole region A. Also, the radially opposite-side two parallel segments 97a (parallel segments 97a1 and 97a2 and parallel segments 97a5 and 97a6) extend in such a direction as not to overlie the hole region A and are connected to each other in such a manner as to be turned back at a second turning-back segment 101a immediately before the boundary between the heating zones 91.

Furthermore, the first turning-back segment 99a is recessed to a greater extent in the direction opposite the adjacent second heating zone 91b (i.e., toward the inward side of the first heating zone 91a or leftward in FIG. 8) than is the second turning-back segment 101a.

Meanwhile, the second zone heat-generating element 93b is formed of the second heat-generating conductor 95b having parallel segments 97b (parallel segments 97b1 to 97b6). Also, the parallel segments 97b of the second heat-generating conductor 95b are disposed in such a manner as to extend toward the adjacent first heating zone 91a and to turn back (toward the opposite side) before the adjacent first heating zone 91a.

More specifically, of the parallel segments 97b, radially central two parallel segments 97b3 and 97b4 extending toward the hole region A are connected to (in FIG. 8, vertically upper and lower) parallel segments 97b2 and 97b5, respectively, in such a manner as to be turned back at first turning-back segments 99b in order to avoid overlying the hole region A. Also, radially opposite-side parallel segments 97b1 and 97b6 extend in such a direction as not to overlie the hole region A and such that ends 103b thereof reach positions located immediately before the boundary between the heating zones 91.

Furthermore, portions of the first turning-back segments 99b are recessed to a greater extent in the direction opposite the adjacent first heating zone 91a (i.e., toward the inward side of the second heating zone 91b or rightward in FIG. 8) than are the ends 103b of the parallel segments 97b1 and 97b6 extending in such a direction as not to overlie the hole region A.

That is, those segments of the heat-generating conductors 95 of the first and second zone heat-generating elements 93a and 93b between which the hole region A is located are recessed to a greater extent toward the inward sides of the heating zones 91 (i.e., those segments are deformed) as compared with the case of the other heating zones 91 having no hole region A.

The first turning-back segments 99*a* and 99*b* are curved in an arc shape so as to be similar to the circular shape of the hole region A.

Similar to the first embodiment, the second embodiment also yields the following effect: in-plane temperature distribution can be readily made uniform, and control parameters can be readily adjusted.

Particularly, according to the second embodiment, since the dispositions of the heat-generating conductors 95 of the zone heat-generating elements 93 of the adjacent heating zones 91 are modified (as compared with the case of the heating zones 91 having no hole region A) for providing the hole region A between the zone heat-generating elements 93, the difference in resistance is small between the zone heat-generating elements 93, whereby excellent temperature controllability is provided.

b) Next, Examples of Experiment Regarding the Second Embodiment Will be Described Third Example of Experiment Regarding the third example of experiment, experiment was conducted under conditions similar to those of the first example of experiment by use of a model similar to that used in the first example of experiment except that the hole region A and the zone heat-generating elements are configured as in the case of the second embodiment.

More specifically, the ceramic heater was configured similarly to the case of the first example of experiment. The heat-generating conductors are disposed similarly to the case of the second embodiment (see the ceramic heater shown in FIG. 9A).

Heating conditions were also similar to those of the first example of experiment.

Figure 9A:
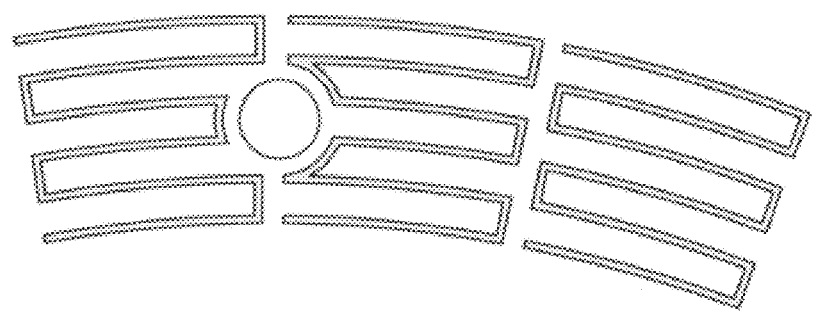
FIG. 9A is a plan view showing the zone heat-generating elements of a ceramic heater used in the third example of experiment.
Figure 9B:
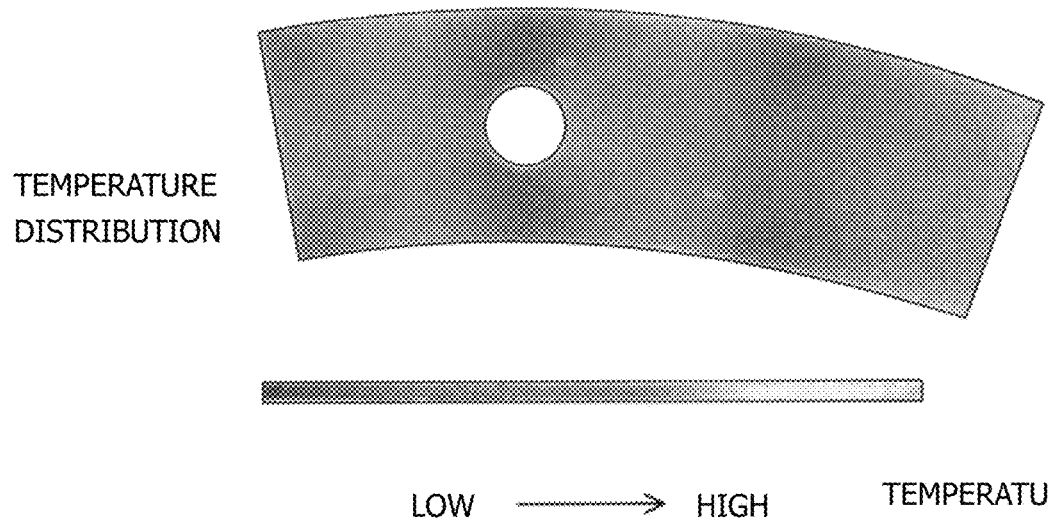
FIG. 9B is an explanatory view showing the condition of heat generation of the heating zones in the third example of experiment.

FIG. 9B shows temperature distribution of the above-mentioned model heated under the above-mentioned conditions.

As shown in FIG. 9B, in the model having the configuration of the second embodiment, a temperature difference is small among the periphery of the hole region A and the heating zones, indicating that the ceramic heater can have favorably uniform in-plane temperature distribution.

Fourth Example of Experiment

As in the case of the above-mentioned second example of experiment, the fourth example of experiment examined the heating zone having no hole region A (through hole) and the heating zone having the hole region A (through hole) for the degree of temperature rise.

Specifically, in the model of the third example of experiment mentioned above, the heating zones were examined for temperature variation through application of a predetermined voltage (e.g., 20 V) to the respective zone heat-generating elements.

Temperature was measured at similar positions of the heating zones (e.g., corners such as upper right corners in FIG. 9A).

Figure 10:
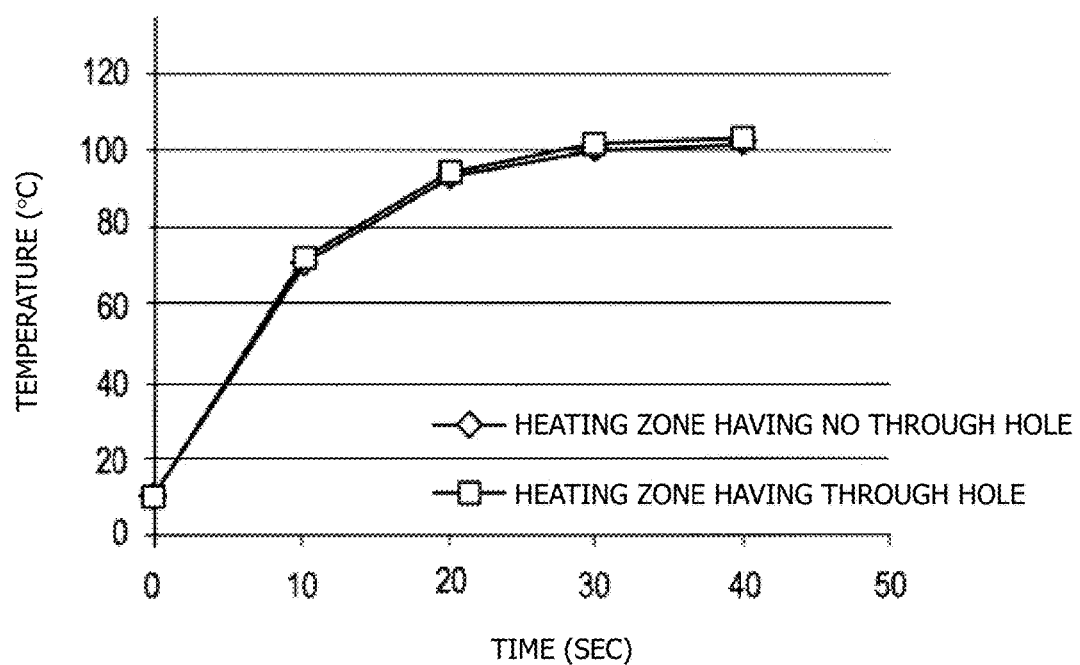
FIG. 10 is a graph showing variation in temperature rise in the ceramic heater of the fourth example of experiment.

FIG. 10 shows the results of the experiment. As is apparent from FIG. 10, in the case of the model of the second embodiment, also, the heating zone having no hole region A and the heating zone having the hole region A exhibit substantially the same temperature rise, indicating that the heating zones reach substantially similar temperature in substantially similar time.

C. Third Embodiment

Next, a third embodiment of the present invention will be described; however, description of structural features similar to those of the first embodiment is omitted.

Members similar to those of the first embodiment are denoted by the same reference numerals as those of the first embodiment.

Figure 11A:
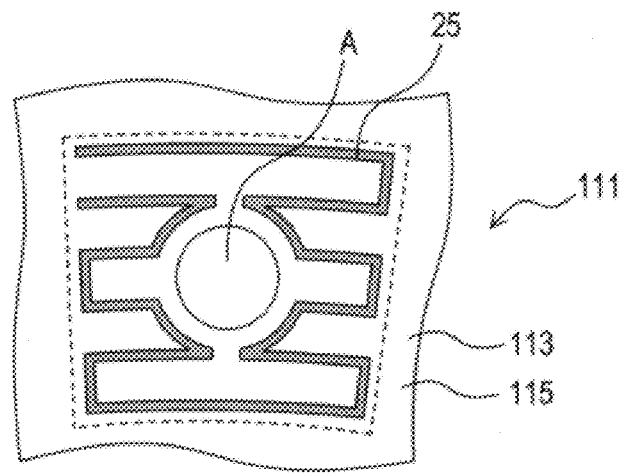
FIG. 11A is a plan view showing a part of zone heat-generating elements of an electrostatic chuck of a third embodiment of the present invention.
Figure 11B:
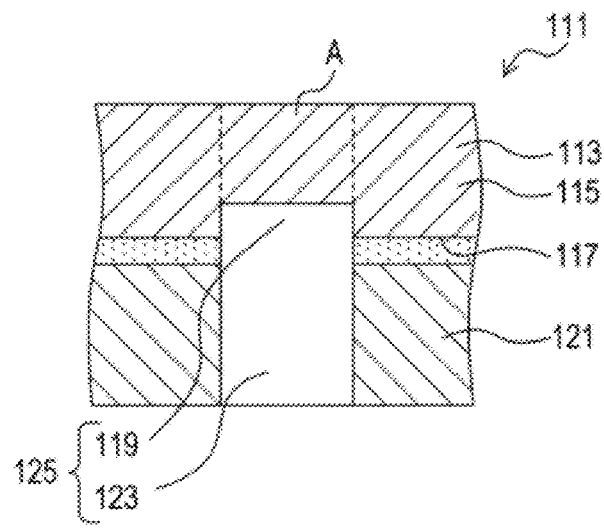
FIG. 11B is a sectional view showing a portion of the electrostatic chuck in section taken in the thickness direction.

As shown in FIGS. 11A and 11B, an electrostatic chuck 111 of the third embodiment is configured such that a ceramic heater 113 (accordingly, a ceramic substrate 115) has a recess 119 formed in a second main surface 117 thereof and such that a metal base 121 has a through hole 123 extending therethrough and communicating with the recess 119.

The recess 119 and the through hole 123 constitute a communication hole 125. The hole region A is a region of projection of the communication hole 125; i.e., a circular region of projection shown in FIG. 11A formed by projecting the communication hole 125 of FIG. 11B upward in FIG. 11B (toward the chucking surface).

The ceramic heater 113 has the zone heat-generating element 25 formed therein around the hole region A, as viewed in plane, in such a manner as to avoid interfering with the hole region A similarly to the case of the first embodiment.

Although the communication hole 125 differs from a through hole extending through the electrostatic chuck as in the case of the first embodiment, the third embodiment yields effects similar to those yielded by the first embodiment.

Figure 11C:
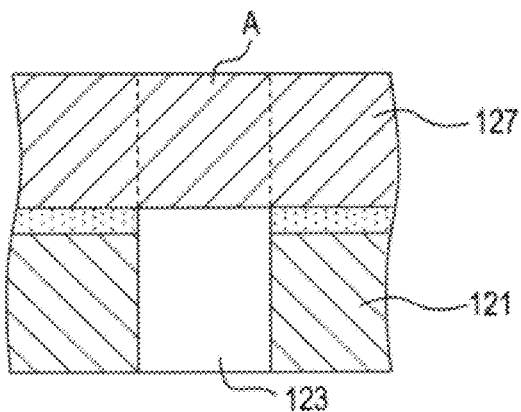
FIG. 11C is a sectional view showing a portion of a modified embodiment of the electrostatic chuck in section taken in the thickness direction.

The electrostatic chuck can employ a modified configuration of the third embodiment as shown in FIG. 11C.

According to the modified embodiment, a ceramic heater 127 does not have a recess formed therein; only the metal base 121 has the through hole 123 formed therein; and the hole region A is a region of projection of the through hole 123.

The modified embodiment also yields effects similar to those yielded by the first embodiment.

D. Fourth Embodiment

Next, a fourth embodiment of the present invention will be described; however, description of structural features similar to those of the second embodiment is omitted.

Members similar to those of the second embodiment are denoted by the same reference numerals as those of the second embodiment.

Figure 12A:
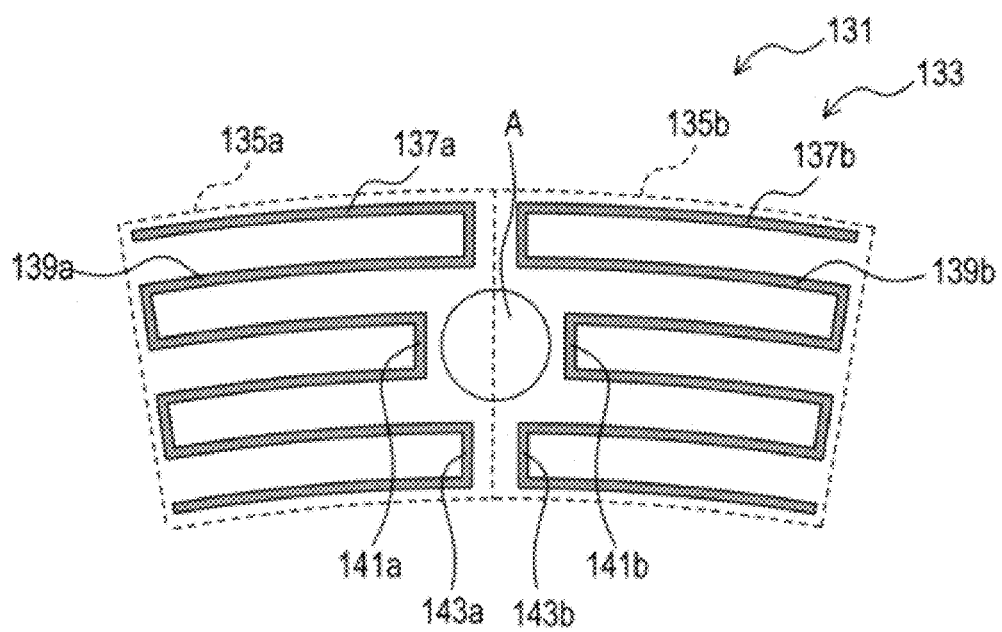
FIG. 12A is a plan view showing a part of zone heat-generating elements of an electrostatic chuck of a fourth embodiment of the present invention.

As shown in FIG. 12A, in an electrostatic chuck 131 of the fourth embodiment, as viewed in plane, a ceramic heater 133 has the hole region A provided between a first zone heat-generating element 137*a* of a first heating zone 135*a* and a second zone heat-generating element 137*b* of a second heating zone 135*b*.

The first and second zone heat-generating elements 137*a* and 137*b* are bilaterally symmetric. In order to avoid interference with the hole region A, first and second heat-generating conductors 139*a* and 139*b* of the first and second zone heat-generating elements 137*a* and 137*b*, respectively, are meandered in such a manner as to be recessed toward the inward sides of the first and second heating zones 135*a* and 135*b*.

More specifically, first turning-back segments 141a and 141b of the first and second heat-generating conductors 139a and 139b (provided to avoid overlying the hole region A, which would otherwise result from extension toward the adjacent second and first heating zones 135b and 135a, respectively) are recessed to a greater extent toward the inward sides of the first and second heating zones 135a and 135b (leftward and rightward, respectively, in FIG. 12A) than are vertically (in FIG. 12A) opposite-side second turning-back segments 143a and 143b (provided in the case where extension toward the adjacent second and first heating zones 135b and 135a, respectively, does not result in overlying the hole region A).

The first turning-back segments 141a and 141b are merely squarishly U-shaped rather than having an arc shape similar to the circular shape of the hole region A.

The fourth embodiment also yields effects similar to those yielded by the second embodiment.

E. Fifth Embodiment

Next, a fifth embodiment of the present invention will be described; however, description of structural features similar to those of the second embodiment is omitted.

Members similar to those of the second embodiment are denoted by the same reference numerals as those of the second embodiment.

Figure 12B:
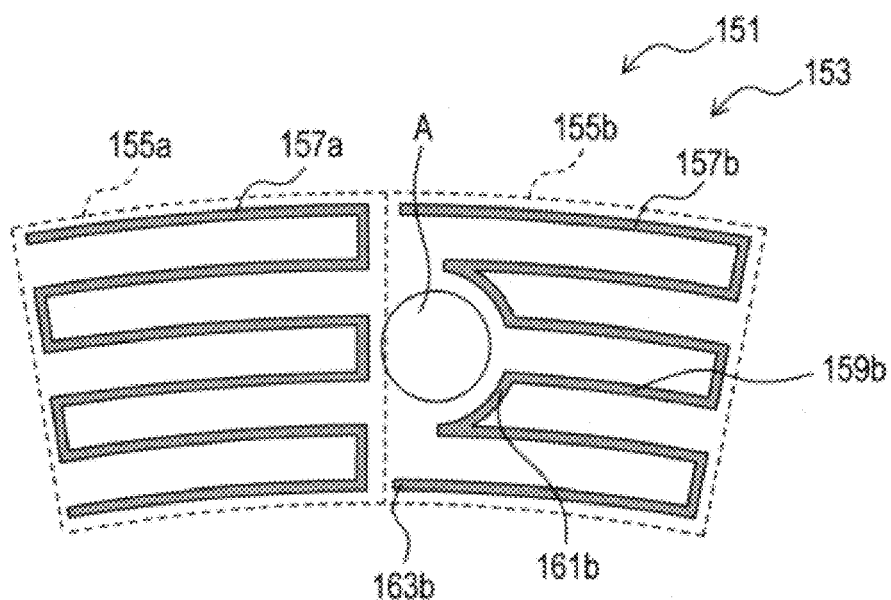
FIG. 12B is a plan view showing a part of zone heat-generating elements of an electrostatic chuck of a fifth embodiment of the present invention.

As shown in FIG. 12B, in an electrostatic chuck 151 of the fifth embodiment, as viewed in plane, a ceramic heater 153 has the hole region A provided between a first zone heat-generating element 157a of a first heating zone 155a and a second zone heat-generating element 157b of a second heating zone 155b.

In the fifth embodiment, different from the second embodiment, only the second zone heat-generating element 157b is deformed substantially similar to the case of the second embodiment in order to avoid interference with the hole region A, whereas the other adjacent first zone heat-generating element 157a is similar to the zone heat-generating elements of the heating zones having no hole region A.

More specifically, first turning-back segments 161b of a second heat-generating conductor 159b (provided to avoid overlying the hole region A, which would otherwise result from extension toward the adjacent first heating zone 155a) are recessed to a greater extent toward the inward side of the second heating zone 155b (rightward in FIG. 12B) than are vertically (in FIG. 12B) opposite-side ends 163b of the second heat-generating conductor 159b (located toward the first heating zone 155a and not overlying the hole region A even through extension).

The fifth embodiment also yields effects similar to those yielded by the second embodiment.

The present invention is not limited to the embodiments and modifications described above, but may be embodied in various other forms without departing from the scope of the invention.

(1) For example, the above embodiments are described while referring to the electrostatic chuck configured such that the ceramic heater and the metal base are bonded together. However, the present invention can also be applied to an independent ceramic heater; even in this case, the ceramic substrate can have favorably uniform in-plane temperature distribution in a central region thereof.

(2) Also, the configurations of the embodiments can be combined as appropriate.

DESCRIPTION OF REFERENCE NUMERALS 1, 81, 111, 131, 151: electrostatic chuck
3: semiconductor wafer
9, 83, 113, 127, 133, 153: ceramic heater
11: metal base
15: lift pin hole
17: cooling path
19, 85, 115: ceramic substrate
21: chucking electrode
23, 91, 91a, 91b, 135a, 135b, 155a, 155b: heating zone
25, 25a, 25b, 93, 93a, 93b, 137a, 137b, 157a, 157b: zone heat-generating element
61, 61a, 61b, 95, 95a, 95b, 139a, 139b, 159b: heat-generating conductor
63a, 63b, 97a, 97b: parallel segment
65a, 65b, 99a, 99b, 101a, 141a, 141b, 143a, 143b, 161b: turning-back segment
103b, 163b: end
A: hole region

What is claimed is:

1. A ceramic heater having a plate-like form and comprising:
   a laminate of a ceramic substrate and a base substrate, the ceramic substrate including an internal heat-generating element,
   wherein, as viewed in a thickness direction, the ceramic heater has heating zones and a hole region disposed within a certain one of the heating zones, the hole region corresponding to:
      (a) a hole defined by the ceramic substrate, or
      (b) a through hole defined by the base substrate;
   the internal heat-generating element includes zone heat-generating elements disposed in respective heating zones so as to heat the ceramic substrate independently; and
   a zone heat-generating element disposed in the certain one of the heating zones having the hole region is formed of a heat-generating conductor which has a first parallel segment disposed in parallel with a second adjacent parallel segment and a turning-back segment which connects, while turning back, the first and second parallel segments of the heat-generating conductor extending toward the hole region so as to prevent the first and second parallel segments extending toward the hole region from overlying the hole region;
   wherein, as viewed in the thickness direction, the entire turning-back segment is positioned between the first parallel segment and the second parallel segment.

2. The ceramic heater according to claim 1, wherein the turning-back segment of the heat-generating conductor extends along a circumference of the hole region.

3. An electrostatic chuck comprising the ceramic heater according to claim 1,
   wherein the base substrate is a metal base, and the ceramic substrate has chucking electrodes configured to chuck an object to be chucked.

4. The electrostatic chuck according to claim 3, wherein the base substrate defines a cooling path configured to allow cooling fluid to flow therethrough.

5. The ceramic heater according to claim 1, wherein the heat-generating conductor further has a third parallel segment disposed in parallel with a fourth adjacent parallel segment and a second turning-back segment which connects, while turning back, the third and fourth parallel segments of the heat-generating conductor extending toward the hole region so as to prevent the third and fourth parallel segments extending toward the hole region from overlying the hole region;

wherein, as viewed in the thickness direction, the entire second turning-back segment is positioned between the third parallel segment and the fourth parallel segment; and wherein, as viewed in the thickness direction, the first parallel segment and the second parallel segment extend toward one side of the hole region and the third parallel segment and the fourth parallel segment extend toward another side of the hole region.

6. A ceramic heater having a plate-like form and comprising:

a ceramic substrate including an internal heat-generating element and defining a hole, wherein, as viewed in a thickness direction, the ceramic heater has heating zones and a hole region disposed within a certain one of the heating zones, the hole region corresponding to the hole defined by the ceramic substrate;

the internal heat-generating element includes zone heat-generating elements disposed in respective heating zones so as to heat the ceramic substrate independently; and a zone heat-generating element disposed in the certain one of the heating zones having the hole region is formed of a heat-generating conductor which has a first parallel segment disposed in parallel with a second adjacent parallel segment and a turning-back segment which connects, while turning back, the first and second parallel segments of the heat-generating conductor extending toward the hole region so as to prevent the first and second parallel segments extending toward the hole region from overlying the hole region;

wherein, as viewed in the thickness direction, the entire turning-back segment is positioned between the first parallel segment and the second parallel segment.

7. The ceramic heater having a plate-like form according to claim 6, wherein the heat-generating conductor further has a third parallel segment disposed in parallel with a fourth adjacent parallel segment and a second turning-back segment which connects, while turning back, the third and fourth parallel segments of the heat-generating conductor extending toward the hole region so as to prevent the third and fourth parallel segments extending toward the hole region from overlying the hole region;

wherein, as viewed in the thickness direction, the entire second turning-back segment is positioned between the third parallel segment and the fourth parallel segment; and wherein, as viewed in the thickness direction, the first parallel segment and the second parallel segment extend toward one side of the hole region and the third parallel segment and the fourth parallel segment extend toward another side of the hole region.

\* \* \* \* \*